(12) United States Patent
Liu et al.

(10) Patent No.: US 12,176,911 B2
(45) Date of Patent: Dec. 24, 2024

(54) AUDIO PROCESSING APPARATUS AND METHOD HAVING ECHO CANCELING MECHANISM

(71) Applicant: SigmaStar Technology Ltd., Fujian (CN)

(72) Inventors: Jie Liu, Fujian (CN); Jin-Tao Wang, Fujian (CN)

(73) Assignee: SIGMASTAR TECHNOLOGY LTD., Fujian (CN)

( * ) Notice: Subject to any disclaimer, the term of this patent is extended or adjusted under 35 U.S.C. 154(b) by 152 days.

(21) Appl. No.: 18/080,982

(22) Filed: Dec. 14, 2022

(65) Prior Publication Data

US 2024/0056090 A1 Feb. 15, 2024

(30) Foreign Application Priority Data

Aug. 10, 2022 (CN) .......................... 202210954034.9

(51) Int. Cl.
| | |
|---|---|
| *H03M 1/00* | (2006.01) |
| *H03G 3/00* | (2006.01) |
| *H03M 1/06* | (2006.01) |
| *H03M 1/12* | (2006.01) |
| *H03M 1/66* | (2006.01) |
| *H04R 1/10* | (2006.01) |

(52) U.S. Cl.
CPC .......... *H03M 1/0626* (2013.01); *H03G 3/001* (2013.01); *H03M 1/122* (2013.01); *H03M 1/124* (2013.01); *H03M 1/66* (2013.01); *H04R 1/1041* (2013.01)

(58) Field of Classification Search
CPC .... H04M 9/082; H04M 1/6033; H04M 19/00; H04M 19/04; G10K 2210/3028; G10K 11/17855; G10K 11/17881; G10K 11/17885; G10K 2210/1081; G10K 2210/3055; H04R 2430/03; H04R 2499/15; H04R 25/356; H04R 25/453; H04R 25/502; H04R 29/001; H04R 3/02; H04R 3/12
USPC ......................................... 341/110, 118–121
See application file for complete search history.

(56) References Cited

U.S. PATENT DOCUMENTS 3,924,077 A * 12/1975 Blakeslee ............. H04M 9/025
370/433
5,646,990 A * 7/1997 Li ........................ H04M 9/082
379/390.01

(Continued)

*Primary Examiner* — Linh V Nguyen
(74) *Attorney, Agent, or Firm* — WPAT, P.C

(57) ABSTRACT

An audio processing apparatus having an echo canceling mechanism is provided. An audio transmission circuit receives an input digital audio signal from an external device. A DAC circuit performs conversion according to the input digital audio signal to generate an output analog audio signal to an external display device for power amplification and playback. An ADC circuit performs analog-to-digital conversion on an amplified signal generated by a power amplification circuit and a received audio signal generated by an audio receiving device to generate an amplified digital signal and a received digital audio signal. A processor implements an echo canceling algorithm to perform echo cancellation according to the amplified digital signal and the received digital audio signal to generate an output digital audio signal to be transmitted to the external device through the audio transmission circuit.

12 Claims, 6 Drawing Sheets

(56) References Cited

U.S. PATENT DOCUMENTS

| | | | | |
|---|---|---|---|---|
| 5,838,787 | A * | 11/1998 | Ding | H04M 9/082 |
| | | | | 379/390.01 |
| 5,936,872 | A * | 8/1999 | Fischer | G06F 7/4812 |
| | | | | 708/622 |
| 6,049,606 | A * | 4/2000 | Ding | H04M 9/082 |
| | | | | 379/406.08 |
| 7,042,986 | B1 * | 5/2006 | Lashley | H04M 1/6025 |
| | | | | 379/390.01 |
| 8,103,011 | B2 * | 1/2012 | Mohammad | H04M 19/04 |
| | | | | 381/71.11 |
| 9,197,318 | B1 * | 11/2015 | Mosinskis | G01J 1/4257 |
| 9,949,031 | B2 * | 4/2018 | Elkhatib | H04R 3/12 |
| 2013/0163748 | A1 * | 6/2013 | Khanduri | H04M 9/082 |
| | | | | 379/406.01 |
| 2013/0216057 | A1 * | 8/2013 | Thyssen | H04M 9/082 |
| | | | | 381/66 |
| 2015/0214972 | A1 * | 7/2015 | Beckers | G01R 15/08 |
| | | | | 341/118 |
| 2016/0240184 | A1 * | 8/2016 | Raja | G10K 11/17881 |
| 2017/0142532 | A1 * | 5/2017 | Pan | H04M 9/082 |

* cited by examiner

AUDIO PROCESSING APPARATUS AND METHOD HAVING ECHO CANCELING MECHANISM

This application claims the benefit of China application Serial No. CN202210954034.9, filed on Aug. 10, 2022, the subject matter of which is incorporated herein by reference.

BACKGROUND OF THE INVENTION

Field of the Invention

The disclosure relates to an echo canceling mechanism, and more particularly, to an audio processing apparatus and method having an echo canceling mechanism.

Description of the Related Art

Echo canceling is a critical technique in sound acquisition. The echo canceling technique cancels an echo through estimation of an echo path, so as to achieve the object of preventing echo interference during sound acquisition.

The process of echo estimation needs to be performed according to a reference signal. However, the precision of the reference signal directly affects the quality of echo cancellation, and determines the quality of sound acquisition. Therefore, there is a need for a solution for enhancing the precision of the reference signal.

SUMMARY OF THE INVENTION

In view of the issues of the prior art, it is an object of the disclosure to provide an audio processing apparatus and method having an echo canceling mechanism so as to improve the prior art.

An audio processing apparatus having an echo canceling mechanism provided by the disclosure includes an audio transmission circuit, a digital-to-analog conversion (DAC) circuit, an analog-to-digital conversion (ADC) circuit and a processor. The audio transmission circuit is configured to receive an input digital audio signal from an external device. The DAC circuit is configured to perform digital-to-analog conversion according to the input digital audio signal to generate an output analog audio signal to a playback device. The playback device includes a power amplification circuit and a loudspeaker. The power amplification circuit performs power amplification on the output analog audio signal to generate an amplified signal, and the loudspeaker plays the amplified signal to generate a playback voice. The ADC circuit is configured to perform analog-to-digital conversion on the amplified signal generated by the power amplification circuit to generate an amplified digital signal, and perform analog-to-digital conversion on a received audio signal generated by an audio receiving device to generate a received digital audio signal, wherein the received audio signal includes a component of the playback voice. The processor is configured to implement an echo canceling algorithm to perform echo cancellation on the received digital audio signal according to the amplified digital signal to generate an output digital audio signal to be transmitted to the external device through the audio transmission circuit.

An audio processing method having an echo canceling mechanism is further provided by the disclosure. The audio processing method is applied to an audio processing apparatus, and includes: receiving an input digital audio signal by an audio transmission circuit from an external device; performing digital-to-analog conversion by a DAC circuit according to the input digital audio signal to generate an output analog audio signal to a playback device, wherein the playback device includes a power amplification circuit and a loudspeaker, the power amplification circuit performs power amplification on the output analog audio signal to generate an amplified signal, and the loudspeaker plays the amplified signal to generate a playback voice; performing analog-to-digital conversion on the amplified signal generated by the power amplification circuit by an ADC circuit to generate an amplified digital signal, and performing analog-to-digital conversion on a received audio signal generated by an audio receiving device to generate a received digital audio signal, wherein the received audio signal includes a component of the playback voice; implementing an echo canceling algorithm by a processor to perform echo cancellation on the received digital audio signal according to the amplified digital signal to generate an output digital audio signal; and transmitting the output digital audio signal to the external device through the audio transmission circuit.

Features, implementations and effects of the disclosure are described in detail in preferred embodiments with the accompanying drawings below.

BRIEF DESCRIPTION OF THE DRAWINGS

To better describe the technical solution of the embodiments of the present application, drawings involved in the description of the embodiments are introduced below. It is apparent that, the drawings in the description below represent merely some embodiments of the present application, and other drawings apart from these drawings may also be obtained by a person skilled in the art without involving inventive skills.

DETAILED DESCRIPTION OF THE INVENTION

It is an object of the disclosure to provide an audio processing apparatus and method having an echo canceling mechanism, wherein a signal having been processed by a power amplification circuit of a playback device is selected as a reference signal in an echo canceling algorithm, hence enhancing the precision of a feedback mechanism and further improving echo cancellation performance.

Figure 1:
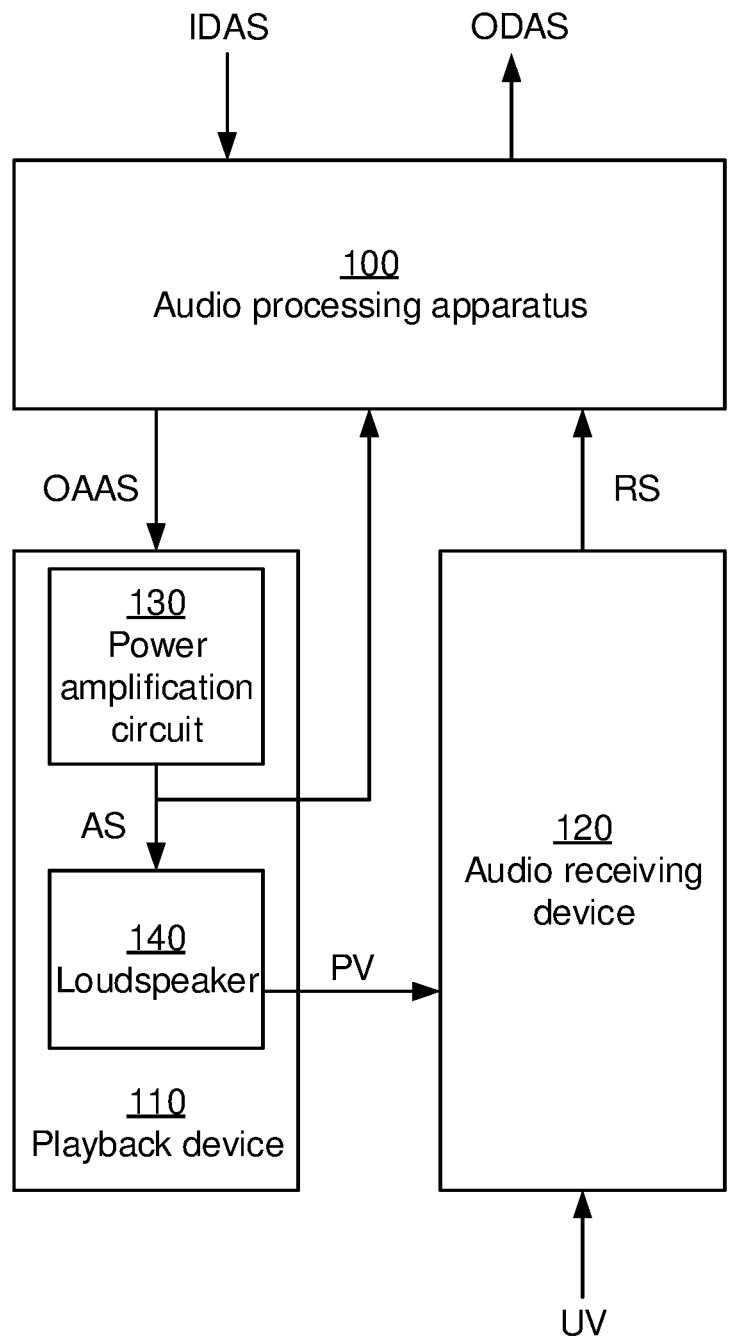
FIG. 1 is a block diagram of an audio processing apparatus having an echo canceling mechanism, a playback device and an audio receiving device according to an embodiment of the disclosure.

Refer to FIG. 1. FIG. 1 shows a block diagram of an audio processing apparatus 100 having an echo canceling mechanism, a playback device 110 and an audio receiving device 120 according to an embodiment of the disclosure.

By using the playback device 110 and the audio receiving device 120 provided outside the audio processing apparatus 100, the audio processing apparatus 100, under operations of a local user, is capable of performing voice communications with an external device (not shown) operated by a remote user.

More specifically, the audio processing apparatus 100 receives, by, for example but not limited to, a network or other data transmission means, an input digital audio signal IDAS from an external device (not shown) operated by a remote user, processes the input digital audio signal IDAS, and then generates an output analog audio signal OAAS that is to be transmitted to the playback device 110 to perform playback and generate a playback voice PV to be heard by the local user. In one embodiment, the playback device 110 is a speaker.

The audio receiving device 120 receives a user voice UV of the local user, at the same time receives the playback voice PV played and generated by the playback device 110, and eventually generates a received audio signal RS that is to be received by the audio processing apparatus 100. In one embodiment, the audio receiving device 120 is a microphone.

One primary object of the audio processing apparatus 100 is to process and transmit the user voice UV received by the audio receiving device 120 for the remote user to hear. To prevent the received audio signal RS from including the playback voice PV that may cause the remote user to hear an echo thereof, the audio processing apparatus 100 can receive an amplified signal AS generated by the playback device 110 according to an echo canceling mechanism, and accordingly perform echo cancellation on the component in the received audio signal RS corresponding to the playback voice PV. The audio processing apparatus 100 transmits the output digital audio signal ODAS by, for example but not limited to, a network or other data transmission means to the external device.

The structure and operation of the audio processing apparatus 100 are to be described in detail below.

Figure 2:
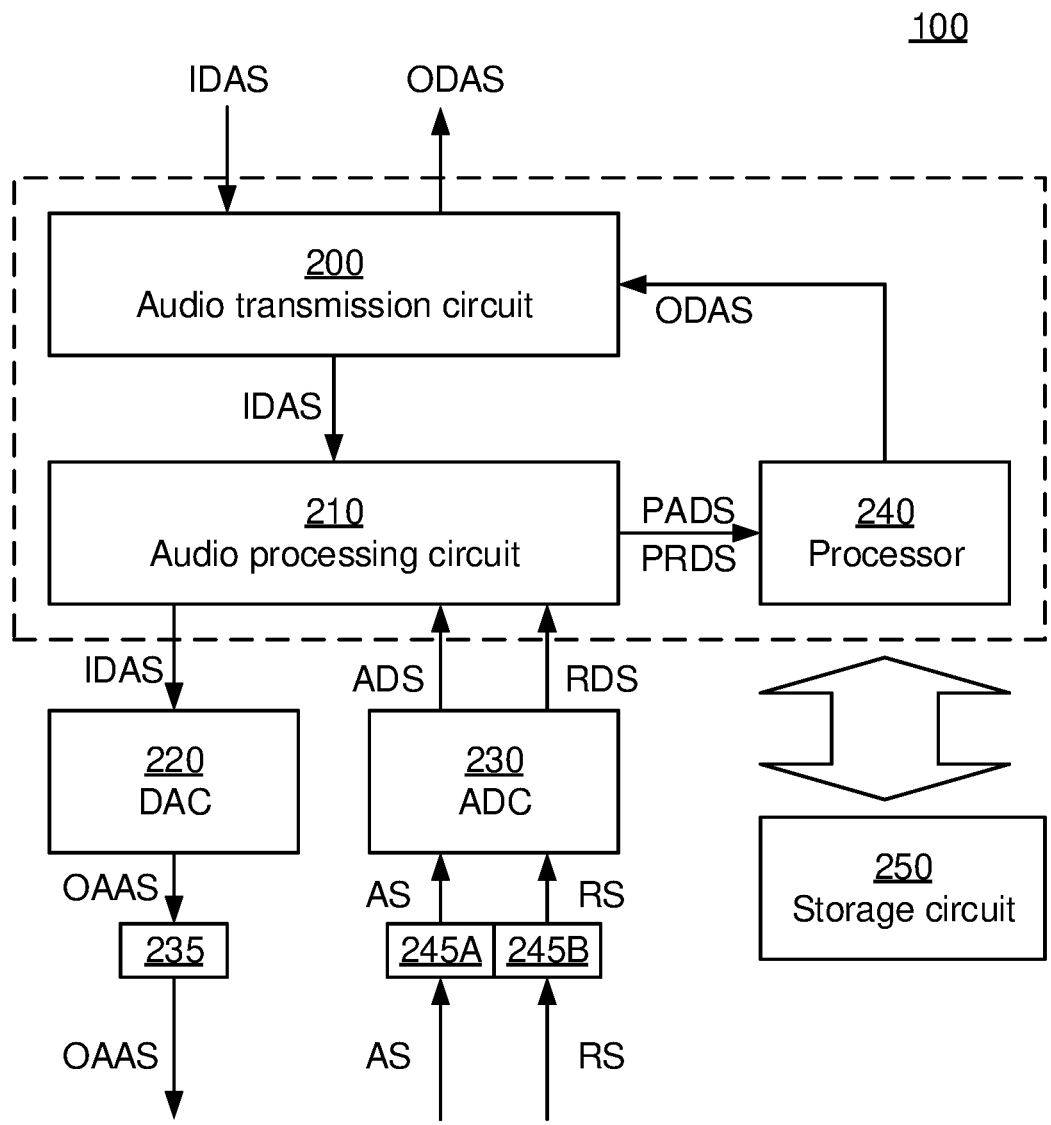
FIG. 2 is a more detailed block diagram of an audio processing apparatus according to an embodiment of the disclosure.

Refer to FIG. 2. FIG. 2 shows a more detailed block diagram of the audio processing apparatus 100 according to an embodiment of the disclosure.

The audio processing apparatus 100 includes an audio transmission circuit 200, an audio processing circuit 210, a digital-to-analog conversion (DAC) circuit 220, an analog-to-digital conversion (ADC) circuit 230, a processor 240 and a storage circuit 250. The storage circuit 250 is configured to be electrically coupled to the audio transmission circuit 200, the audio processing circuit 210 and the processor 240 included in a dotted frame in FIG. 2, for these circuits to perform data storage and read.

The audio transmission circuit 200 receives the input digital audio signal IDAS from an external device. The audio processing apparatus 200 may transmit the input digital audio signal IDAS by, for example but not limited to, a network or other data transmission means. In one embodiment, when the input digital audio signal IDAS is in an audio encoded format, the audio processing apparatus 100 may further include a decoding circuit (not shown) to perform audio decoding on the input digital audio signal IDAS.

The audio transmission circuit 210 is configured to perform audio processing on the input digital audio signal IDAS. In FIG. 2, the audio processing circuit 210 is depicted as directly receiving the input digital audio signal IDAS from the audio transmission circuit 200. However, in practice, the input digital audio signal IDAS received by the audio transmission circuit 200 may be temporarily stored in the storage circuit 250 and then read by the audio processing circuit 210.

The DAC circuit 220 performs digital-to-analog conversion according to the input digital audio signal IDAS to generate the output analog audio signal OAAS to the playback device 110. In one embodiment, the DAC circuit 220 transmits the output analog audio signal OAAS to the playback device 110 through a line output pin 235.

In one embodiment, the playback device 110 in FIG. 1 includes a power amplification circuit 130 and a loudspeaker 140.

The power amplification circuit 130 is configured to perform power amplification on the output analog audio signal OAAS to generate the amplified signal AS. In different embodiments, the power amplification circuit 130 may be, for example but not limited to, a Class A analog amplifier or a Class D digital amplifier. In one embodiment, the power amplification circuit 130 may have an amplification ratio of 2 times.

The loudspeaker 140 is configured to play the amplified signal AS to generate the playback voice PV to be heard by a user.

The ADC circuit 230 performs analog-to-digital conversion on the amplified signal AS generated by the power amplification circuit 130 to generate an amplified digital signal ADS, and performs analog-to-digital conversion on the received audio signal RS generated by the audio receiving device 120 to generate the amplified digital signal ADS and a received digital audio signal RDS, respectively.

The audio receiving device 120 in fact is configured to receive the user voice UV. However, when an actual distance between the audio receiving device 120 and the playback device 110 is close, the playback voice PV generated by the playback circuit 140 may also be received. Thus, the received audio signal RS generated by audio acquisition performed by the audio receiving device 120 includes both of a component of the user voice UV and a component of the playback voice PV generated according to the input digital audio signal IDAS.

In one embodiment, the ADC circuit 230 receives the amplified signal AS through a line input pin 245A, and receives the received audio signal RS through a received audio input pin 245B.

In one embodiment, the ADC circuit 230 includes one signal ADC circuit having two channels respectively corresponding to the amplified signal AS and the received audio signal RS. In another embodiment, the ADC circuit 230 includes two ADC sub-circuits (not shown) respectively corresponding to the amplified signal AS and the received audio signal RS.

The ADC circuit 230 can perform processes independent from each other on the amplified signal AS and the received audio signal RS. More specifically, due to different ways for generating the amplified signal AS and the received audio signal RS, the time points at which the signals are generated and the intensities of the generated signals are also different. Thus, the ADC circuit 230 does not perform conversion on the amplified signal AS and the received audio signal RS simultaneously. Moreover, the ADC circuit 230 provide different gain values for processing the amplified signal AS and the received audio signal RS.

In one embodiment, the ADC circuit 230 does not amplify the amplified signal AS after receiving the amplified signal AS.

Circuit connection details of the audio processing apparatus 100, the playback device 110 and the audio receiving device 120 are described in the examples below.

Figure 3A:
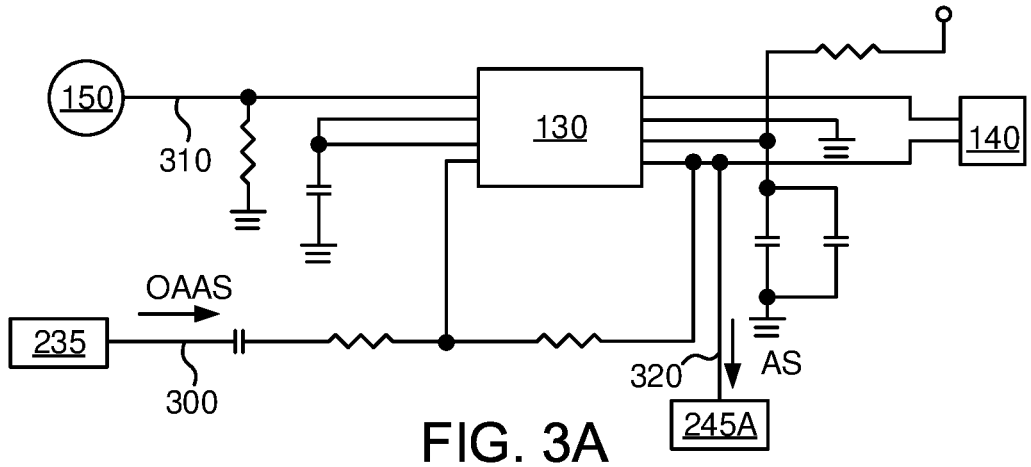
FIG. 3A is a circuit diagram associated with a power amplification circuit according to an embodiment of the disclosure.
Figure 3B:
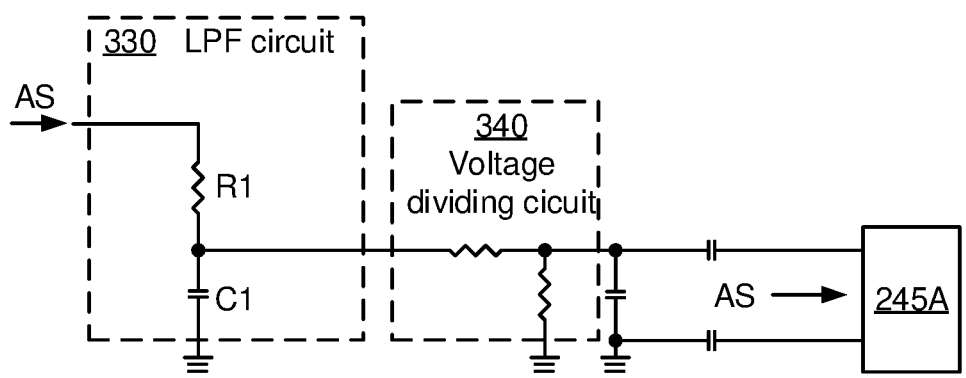
FIG. 3B is a circuit diagram associated with a line input pin according to an embodiment of the disclosure.
Figure 3C:
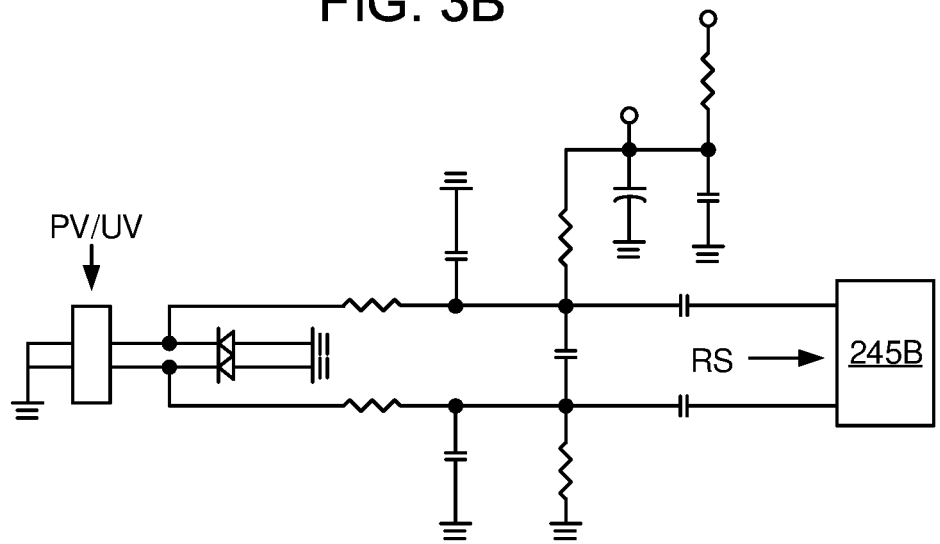
FIG. 3C is a circuit diagram associated with a received audio input pin according to an embodiment of the disclosure.

Refer to FIG. 3A to FIG. 3C. FIG. 3A shows a circuit diagram associated with the power amplification circuit 130 according to an embodiment of the disclosure. FIG. 3B shows a circuit diagram associated with the line input pin 245A according to an embodiment of the disclosure. FIG. 3C shows a circuit diagram associated with the received audio input pin 245B according to an embodiment of the disclosure.

As shown in FIG. 3A, the power amplification circuit 130 is electrically coupled to the line output pin 235 through a line 300 so as to receive the output analog audio signal OAAS, and a GPIO pin 150 achieves turning on/off of the loudspeaker 140 by enabling/disabling the power amplification circuit 130. The power amplification circuit 130 is further electrically coupled to the line input pin 245A through a line 320 so as to transmit the amplified signal AS to the ADC circuit 230.

As shown in FIG. 3B, the line input pin 245A selectively receives the amplified signal AS through a low-pass filter (LFP) circuit 330 and a voltage dividing circuit 340.

In one embodiment, the LPF circuit 330 includes a resistor R1 and a capacitor C1, and can be configured depending on the type of the power amplification circuit 130 so as to perform filtering on the amplified signal AS. For example, in one numerical example, when the power amplification circuit 130 is a Class D digital amplifier, the resistor R1 is 100Ω and the capacitor is 47 nF. When the power amplification circuit 130 is a Class A analog amplifier, the resistor R1 may be configured as a 0Ω resistor (OR), and the capacitor C1 may be configured as not connected (NC).

The voltage dividing circuit 340 is configured to divide the voltage of the filtered amplified signal AS, so that the voltage of the amplified signal AS is less than a predetermined level. In a numerical example, when the non-divided amplification signal AS is 5 V, the voltage dividing circuit 340 may control the divided amplified signal AS to a voltage having a peak value (Vp-p) within 3 V.

As shown in FIG. 3C, the received audio input pin 245B performs filtering through a capacitor-resistor circuit 350 so as to receive the received audio signal RS from the audio receiving device 120. It should be noted that, the structure of the capacitor-resistor circuit 350 shown in FIG. 3C is merely an example, and the disclosure is not limited to such example.

After the amplified digital signal ADS and the received digital audio signal RDS are received, the audio processing circuit 210 is configured to perform audio processing on the amplified digital signal ADS and the received digital audio signal RDS, and then the processor 240 performs echo cancellation according to the processed amplified digital signal PADS and the processed received digital audio signal PRDS.

Figure 4:
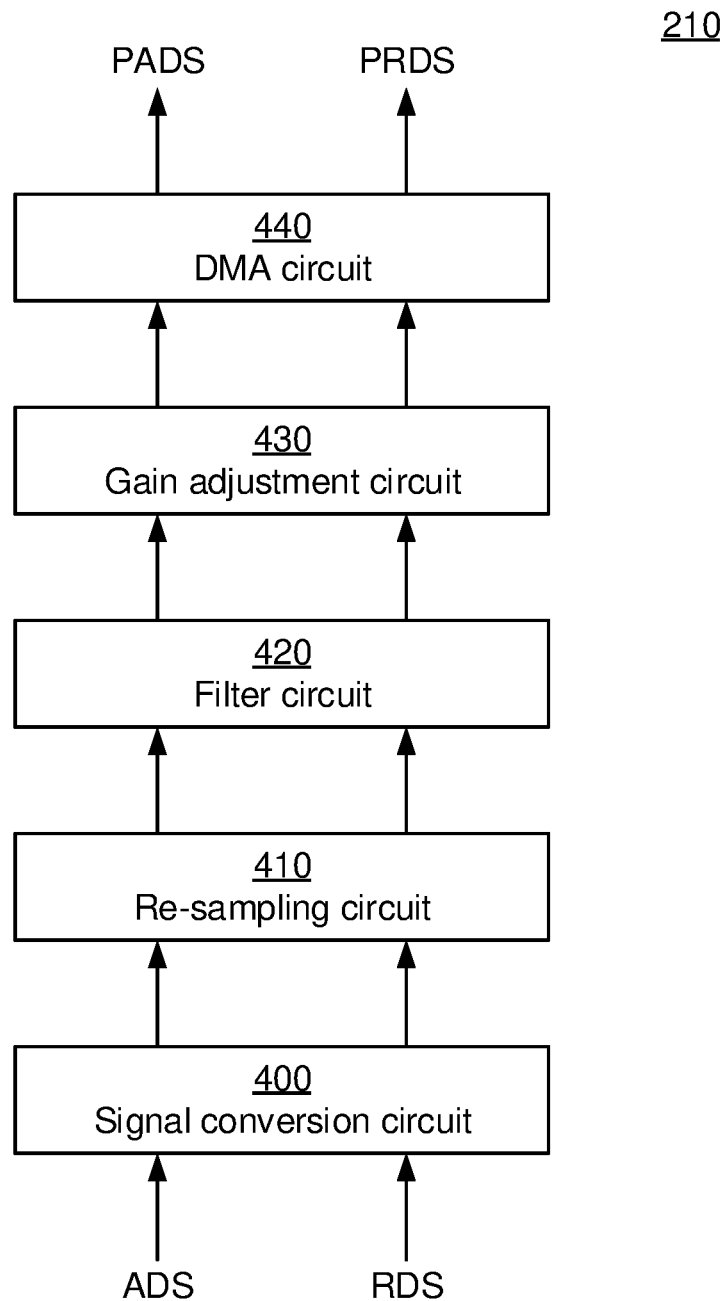
FIG. 4 is a more detailed block diagram of an audio processing circuit according to an embodiment of the disclosure.

Refer to FIG. 4. FIG. 4 shows a more detailed block diagram of the audio processing circuit 210 according to an embodiment of the disclosure. As shown in FIG. 4, the audio processing circuit 210 includes a signal conversion circuit 400, a re-sampling circuit 410, a filter circuit 420 and a gain adjustment circuit 430.

The signal conversion circuit 400 is configured to perform format conversion on the amplified digital signal ADS and the received digital audio signal RDS by, for example but not limited to, converting a pulse density modulation (PDM) format to a pulse code modulation (PCM) format.

The re-sampling circuit 410 is configured to perform sampling rate adjustment on the amplified digital signal ADS and the received digital audio signal RDS having undergone the format conversion, by, for example but not limited to, converting a high sampling rate to a low sampling rate.

The filter circuit 420 is configured to perform filtering on the amplified digital signal ADS and the received digital audio signal RDS having undergone the sampling rate adjustment.

The gain adjustment circuit 430 is configured to perform gain adjustment on the amplified digital signal ADS and the received digital audio signal RDS having undergone the filtering, for the processor 240 to accordingly perform echo cancellation.

In FIG. 2, the processor 240 is depicted as directly receiving a processed amplified digital signal PADS and a processed received digital audio signal PRDS from the audio processing circuit 210. However, in practice, the audio processing circuit 210 may include a direct memory access (DMA) circuit 440, which is configured to transmit to the storage circuit 250 the processed amplified digital signal PADS and the processed received digital audio signal PRDS for temporary storage. The processed amplified digital signal PADS and the processed received digital audio signal PRDS are then read by the processor 240, which then accordingly performs the echo cancellation.

It should be noted that, each of the circuits included in the audio processing circuit 210 is depicted as one in quantity. However, in practice, different numbers of the individual circuits may be provided in response to the amplified digital signal ADS and the received digital audio signal RDS to provide different paths for processing. In addition, the above circuit structure of the audio processing circuit 210 and the performed process are merely an example. In other embodiments, the audio processing circuit 210 may also include different circuits or perform different processes, and the disclosure is not limited to the above examples.

Further, the audio processing performed by the audio processing circuit 210 on the input digital audio signal IDAS may also be the same as the audio processing performed on the amplified digital signal ADS and the received audio signal RDS, or may include different audio processes according to actual requirements.

After reading the processed amplified digital signal PADS and the processed received digital audio signal PRDS from the storage circuit 250, the processor 240 implements an echo canceling algorithm to perform echo cancellation on the processed received audio signal PRDS according to the processed amplified digital signal PADS to generate the output digital audio signal ODAS to be transmitted to the external device through the audio transmission circuit 200. In one embodiment, the processor 240 executes the echo cancellation algorithm by executing internal software.

Figure 5:
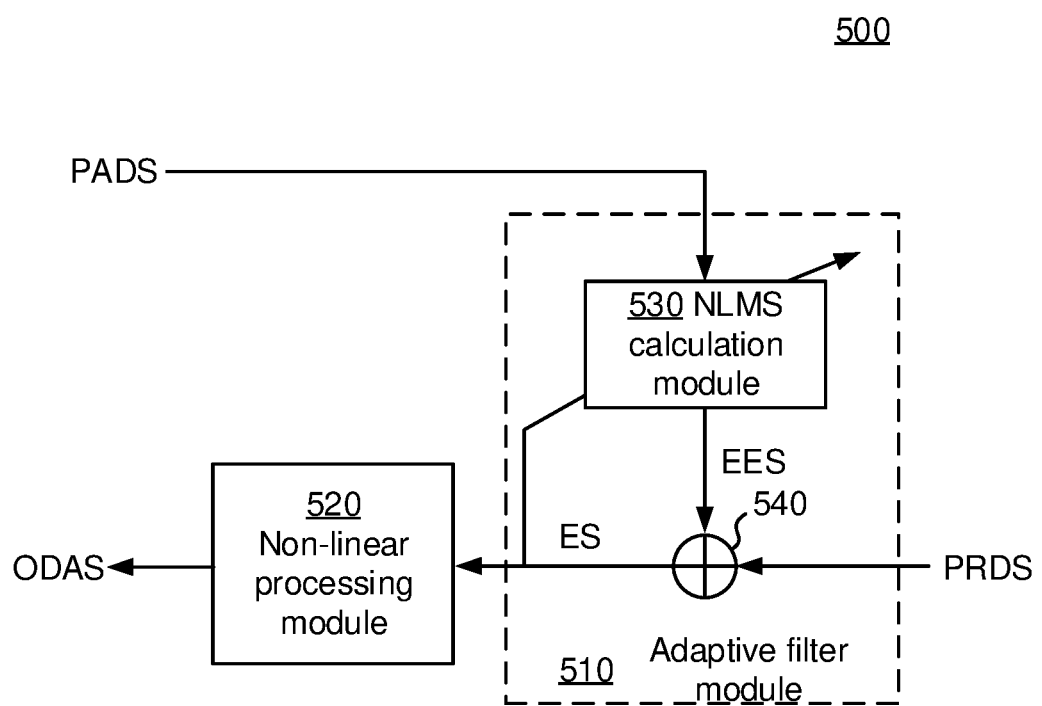
FIG. 5 is a schematic diagram of an echo canceling system according to an embodiment of the disclosure.

Refer to FIG. 5. FIG. 5 shows a schematic diagram of an echo canceling system 500 according to an embodiment of the disclosure. In one embodiment, the echo canceling system 500 is built by a software module executed by the processor 240. As shown in FIG. 5, the echo canceling system 500 includes an adaptive filter module 510 and a non-linear processing module 520.

The adaptive filter module 510 is configured to implement a normalized least mean square (NLMS) algorithm on the processed amplified digital signal PADS and the processed received digital audio signal PRDS, so as to generate an error signal ES through an adaptive mechanism.

In one embodiment, the adaptive filter module 510 may further include an NLMS calculation module 530 and an error calculation module 540. The NLMS calculation module 530 performs calculation according to the processed amplified digital signal PADS and the fed back error signal ES to generate an echo estimation signal EES. The error calculation module 540 further calculates the error signal ES according to the processed received digital audio signal PRDS and the echo estimation signal EES.

Further, the non-linear processing module 520 performs non-linear processing on the error signal ES to generate the output digital audio signal ODAS.

In one embodiment, the audio processing apparatus 100 may further include an encoding circuit (not shown) that selectively performs voice encoding on the output digital audio signal ODAS, which is then transmitted to the external device operated by the remote user by, for example but not limited to, a network or other data transmission means.

Therefore, the audio processing apparatus 100 of the disclosure, by using a signal having been processed by the power amplification circuit 130 of the playback device 110 as the reference signal in an echo canceling algorithm, is capable of enhancing the precision of the feedback mechanism and further improving the echo cancellation performance.

More specifically, the reference signal used for the echo cancellation operation of the disclosure, being the amplified signal AS amplified by the power amplification signal 130 and directly fed back by line to the audio processing apparatus 100, is most similar to the playback voice PV received by the audio receiving device 120. Moreover, both of the amplified signal AS and the playback voice PV in the received audio signal RS are generated by converting a digital audio into an analog audio through the DAC circuit 220 and thus have a higher level of similarity, and so a part that may cause a difference remains only in processes performed by the loudspeaker 140 and the audio receiving device 120. Therefore, the above approach achieves better echo cancellation effects, and the processing of echo cancellation can be more easily controlled.

Figure 6:
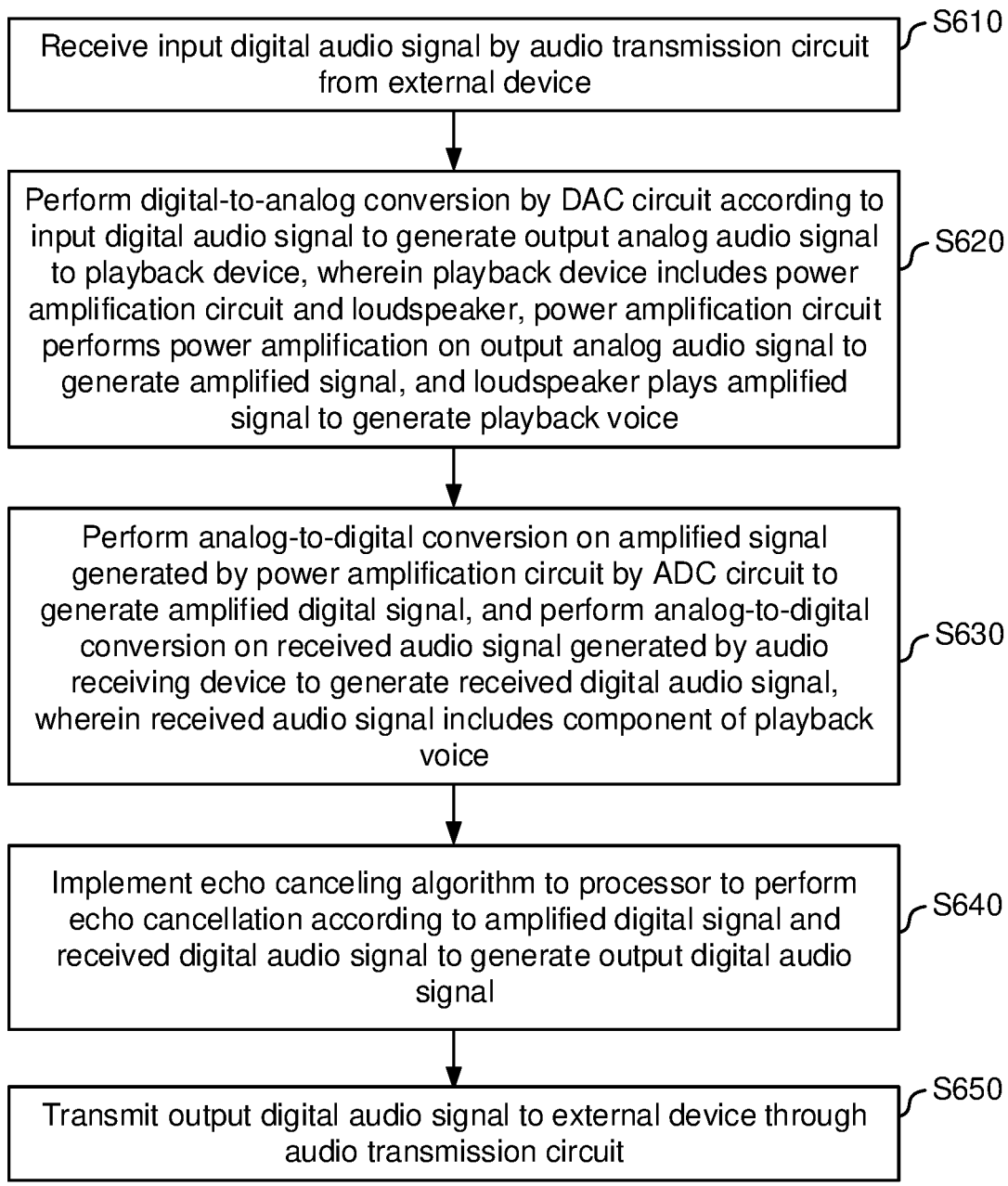
FIG. 6 is a flowchart of an audio processing method having an echo canceling mechanism according to an embodiment of the disclosure.

Refer to FIG. 6. FIG. 6 shows a flowchart of an audio processing method 600 having an echo canceling mechanism according to an embodiment of the disclosure.

In addition to the above apparatus, the disclosure further provides an audio processing method 600 applied to, for example but not limited to, the audio processing apparatus 100 in FIG. 2. According to an embodiment, the audio processing method 600 includes the following steps.

In step S610, an input digital audio signal IDAS is received by the audio transmission device 200 from an external device.

In step S620, digital-to-analog conversion is performed by the DAC circuit 220 according to the input digital audio signal IDAS to generate the output analog audio signal OAAS to the playback device 110. The playback device 110 includes the power amplification circuit 130 and the loudspeaker 140. The power amplification circuit 130 performs power amplification on the output analog audio signal OAAS to generate the amplified signal AS, and the loudspeaker 140 plays the amplified signal AS to generate the playback voice PV.

In step S630, analog-to-digital conversion is performed by the ADC circuit 230 on the amplified signal AS generated by the power amplification circuit 130 to generate the amplified digital signal ADS, and analog-to-digital conversion is performed on the received audio signal RS generated by the audio receiving device 120 to generate the received digital audio signal RDS, wherein the received audio signal RS includes a component of the playback voice PV.

In step S640, an echo canceling algorithm is implemented by the processor 240 to perform echo cancellation according to the amplified digital signal ADS and the received digital audio signal RDS to generate the output digital audio signal ODAS.

In step S650, the output digital audio signal ODAS is transmitted to the external device through the audio transmission circuit 200.

It should be noted that the embodiments above serve as merely examples. In other embodiments, modifications may be made by a person skilled in the art without departing from the spirit of the disclosure.

While the present application has been described by way of example and in terms of the preferred embodiments, it is to be understood that the disclosure is not limited thereto. Various modifications made be made to the technical features of the disclosure by a person skilled in the art on the basis of the explicit or implicit disclosures of the present application. The scope of the appended claims of the disclosure therefore should be accorded with the broadest interpretation so as to encompass all such modifications.

What is claimed is:

1. An audio processing apparatus having an echo canceling mechanism, comprising:
   an audio transmission circuit, configured to receive an input digital audio signal from an external device;
   a digital-to-analog conversion (DAC) circuit is configured to perform digital-to-analog conversion according to the input digital audio signal to generate an output analog audio signal to a playback device, wherein the playback device comprises a power amplification circuit and a loudspeaker, the power amplification circuit performs power amplification on the output analog audio signal to generate an amplified signal, and the loudspeaker plays the amplified signal to generate a playback voice;
   an analog-to-digital conversion (ADC) circuit, configured to perform analog-to-digital conversion on the amplified signal generated by the power amplification circuit to generate an amplified digital signal, and perform analog-to-digital conversion on a received audio signal generated by an audio receiving device to generate a received digital audio signal, wherein the received audio signal comprises a component of the playback voice;
   a processor, configured to implement an echo canceling algorithm to perform echo cancellation on the received digital audio signal according to the amplified digital signal to generate an output digital audio signal to be transmitted to the external device through the audio transmission circuit; and
   an audio processing circuit, configured to perform audio processing on the amplified digital signal and the received digital audio signal to accordingly undergo echo cancellation performed by the processor, wherein the audio processing circuit comprises:
     a signal conversion circuit, configured to perform format conversion on the amplified digital signal and the received digital audio signal;
     a re-sampling circuit, configured to perform sampling rate adjustment on the amplified digital signal and the received digital audio signal having undergone the format conversion;

a filter circuit, configured to perform filtering on the amplified digital signal and the received digital audio signal having undergone the sampling rate adjustment; and a gain adjustment circuit, configured to perform gain adjustment on the amplified digital signal and the received digital audio signal having undergone the filtering.

2. The audio processing apparatus according to claim 1, further comprising:

a storage circuit, configured to temporarily storing the input digital audio signal that to undergo audio processing performed by the audio processing circuit, and storing the amplified digital signal and the received digital audio signal having undergone the audio processing performed by the audio processing circuit to perform echo cancellation accordingly by the processor.

3. The audio processing apparatus according to claim 2, wherein the audio processing circuit further comprises:

a direct memory access (DMA) circuit, configured to transmit the amplified digital signal and the received digital audio signal having undergone the audio processing to the storage circuit for storage.

4. The audio processing apparatus according to claim 1, wherein the ADC circuit does not perform conversion on the amplified signal and the received audio signal simultaneously.

5. The audio processing apparatus according to claim 1, wherein the processor is configured to perform adaptive filtering on the amplified digital signal and the received digital audio signal to generate an error signal, and to perform a non-linear processing on the error signal to generate the output digital audio signal.

6. The audio processing apparatus according to claim 1, wherein before the ADC circuit, the amplified signal is received through a low-pass filter (LPF) circuit and a voltage dividing circuit.

7. The audio processing apparatus according to claim 1, wherein the ADC circuit comprises one signal ADC circuit having two channels respectively corresponding to the amplified signal and the received audio signal.

8. An audio processing method having an echo canceling mechanism, applied to an audio processing apparatus, the method comprising:

receiving an input digital audio signal by an audio transmission circuit from an external device;

performing digital-to-analog conversion by a digital-to-analog conversion (DAC) circuit according to the input digital audio signal to generate an output analog audio signal to a playback device, wherein the playback device comprises a power amplification circuit and a loudspeaker, the power amplification circuit performs power amplification on the output analog audio signal to generate an amplified signal, and the loudspeaker plays the amplified signal to generate a playback voice;

performing analog-to-digital conversion on the amplified signal generated by the power amplification circuit by an analog-to-digital conversion (ADC) circuit to generate an amplified digital signal, and performing analog-to-digital conversion on a received audio signal generated by an audio receiving device to generate a received digital audio signal, wherein the received audio signal comprises a component of the playback voice;

implementing an echo canceling algorithm by a processor to perform echo cancellation on the received digital audio signal according to the amplified digital signal to generate an output digital audio signal;

transmitting the output digital audio signal to the external device through the audio transmission circuit; and performing audio processing on the amplified digital signal and the received digital audio signal by an audio processing circuit, and accordingly performing echo cancellation by the processor;

wherein the step of performing audio processing on the amplified digital signal and the received digital audio signal by the audio processing circuit comprises:

performing format conversion on the amplified digital signal and the received digital audio signal;

performing sampling rate adjustment on the amplified digital signal and the received digital audio signal having undergone the format conversion;

performing filtering on the amplified digital signal and the received digital audio signal having undergone the sampling rate adjustment; and performing gain adjustment on the amplified digital signal and the received digital audio signal having undergone the filtering.

9. The audio processing method according to claim 8, wherein the ADC circuit does not perform conversion on the amplified signal and the received audio signal simultaneously.

10. The audio processing method according to claim 8, wherein the echo canceling algorithm implemented by the processor further comprises:

performing adaptive filtering on the amplified digital signal and the received digital audio signal to generate an error signal, and performing non-linear processing on the error signal to generate the output digital audio signal.

11. The audio processing method according to claim 8, further comprising:

before the ADC circuit, receiving the amplified signal through a low-pass filter (LPF) circuit and a voltage dividing circuit.

12. The audio processing method according to claim 8, wherein the ADC circuit comprises one signal ADC circuit having two channels respectively corresponding to the amplified signal and the received audio signal.

* * * * *